US006933868B1

(12) United States Patent
Premy et al.

(10) Patent No.: US 6,933,868 B1
(45) Date of Patent: Aug. 23, 2005

(54) TESTING OF MIXED SIGNAL INTEGRATED CIRCUITS GENERATING ANALOG SIGNALS FROM DIGITAL DATA ELEMENTS

(75) Inventors: Amit Premy, Guna (IN); Ganesan Thiagarajan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/708,415

(22) Filed: Mar. 2, 2004

(51) Int. Cl.[7] ............................................... H03M 1/10
(52) U.S. Cl. ...................................... 341/120; 341/144
(58) Field of Search ............................... 341/155, 144, 341/118, 120, 143

(56) References Cited

U.S. PATENT DOCUMENTS

| 5,132,685 A | * | 7/1992 | DeWitt et al. ............... 341/120 |
| 5,659,312 A | * | 8/1997 | Sunter et al. ............... 341/120 |
| 6,339,388 B1 | * | 1/2002 | Matsumoto ................. 341/120 |
| 2003/0085726 A1 | * | 5/2003 | Rutten ........................ 324/765 |

* cited by examiner

Primary Examiner—Peguy JeanPierre
(74) Attorney, Agent, or Firm—Abdul Zindani; W. James Brady, III; Frederick J. Telecky, Jr.

(57) ABSTRACT

Testing of a mixed signal integrated circuit (IC) potentially in the form of a die using a tested/calibrated integrated circuit. In an embodiment, the mixed signal IC generates an analog signal from a symbol, and transmits the analog signal to the calibrated integrated circuit. The calibrated IC determines a valid symbol corresponding to the signal level (e.g., voltage) of the received analog signal, and determines a deviation of the signal level of the received analog signal from the voltage level corresponding to the valid symbol. The deviation is deemed to represent the degree of defect of the mixed signal IC based on the assumption that the calibrated IC operates accurately. The deviation is used to either discard or qualify/accept the mixed signal IC.

27 Claims, 5 Drawing Sheets

TESTING OF MIXED SIGNAL INTEGRATED CIRCUITS GENERATING ANALOG SIGNALS FROM DIGITAL DATA ELEMENTS

BACKGROUND OF INVENTION

1. Field of the Invention

The present invention relates to testing of integrated circuits, and more specifically to a method and apparatus for testing mixed signal integrated circuits which generate analog signals from digital data elements.

2. Related Art

Mixed signal integrated circuits (IC) generally refer to circuits which operate on both analog and digital signals. Mixed signal ICs are used in several areas such as communications (both wireless and wire-based) in which digital data elements are converted into analog signals which are eventually transmitted.

A receiving system (using another mixed signal IC) recovers the digital data elements from the analog signals. Other digital data elements may then be transferred in the reverse direction as well. The data thus exchanged is used to support several user applications (e.g., voice calls, networking), as is well known in the relevant arts.

Testing is often performed to determine whether an integrated circuit operates according to design specifications. It may be necessary to discard at least integrated circuits which substantially deviate from the design specification. Thus, by performing such testing, one may ensure that only end products which provide an intended utility, are supplied/sold in the market place.

It is often desirable to test an IC before the IC is integrated into end products, which are eventually sold/supplied. As an illustration, an IC may be placed in a package, the packaged IC may then be placed on a board, and the board may be eventually used in a system which is sold/supplied to an end customer. By testing and discarding the IC at an early stage (e.g., before being placed in a package), unneeded wastage of resources (cost/time/effort) may be avoided.

In one prior testing approach, a transceiver (containing a transmitter, receiver and an antenna) is placed in a loop-back mode in which the output of the transmitter is connected to the input of the receiver, bypassing the antenna. The transmitter converts a sequence of digital data elements into analog signals, which are received by the receiver. The receiver generates a sequence of digital data elements from the received analog signal. Deviations from the design specifications may be determined based on the signal strength of the received analog signals, comparison of the digital data elements used in the transmitter and receiver, etc.

Thus, the prior approach of above enables testing of a transceiver, potentially when the corresponding IC is not yet packaged (and thus only as a stand-alone wafer). one problem with the approach is that many transceivers use common components in the transmit and receive paths, and simultaneous use of both the paths may not thus be possible. In addition, loop-back approaches often skip some portions/stages of the transmit/receive paths, and the test results may accordingly not be reliable.

What is therefore needed is an improved method and apparatus for testing of mixed signal integrated circuits generating analog signals from digital data elements.

BRIEF DESCRIPTION OF DRAWINGS

The present invention will be described with reference to the following accompanying drawings.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

An aspect of the present invention enables testing of a mixed signal integrated circuit (IC) by employing a calibrated (tested) integrated circuit. To test a mixed signal IC in the transmit direction, a symbol (digital data element) is converted into an analog signal at the mixed signal IC. The analog signal is transmitted to a calibrated integrated circuit. The calibrated integrated circuit determines a valid symbol corresponding to the signal level on the received analog signal.

An error magnitude may be measured based on the deviation of the signal level of the received analog signal from a signal level corresponding to the determined valid symbols. The deviation of the mixed signal IC from design specification may be ascertained by performing such measurements corresponding to several symbols. The mixed signal IC may be discarded if the deviation is above a pre-specified threshold. Thus, as aspect of the present invention enables a mixed signal IC to be tested.

According to another aspect of the present invention, the approach described above is implemented with the mixed signal IC being present in the form of a stand-alone die (i.e., not placed in a package). The calibrated IC also can be used in the form of a stand-along die. As a result, unneeded wastage of resources (cost/time/effort with respect to defective ICs) may be avoided. The cost of testing can be further reduced by circuit portions generating the symbols and measurement of the error magnitude within the same die as the mixed signal IC.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well_known structures or operations are not shown in detail to avoid obscuring the invention.

2. Example Environment

Figure 1:
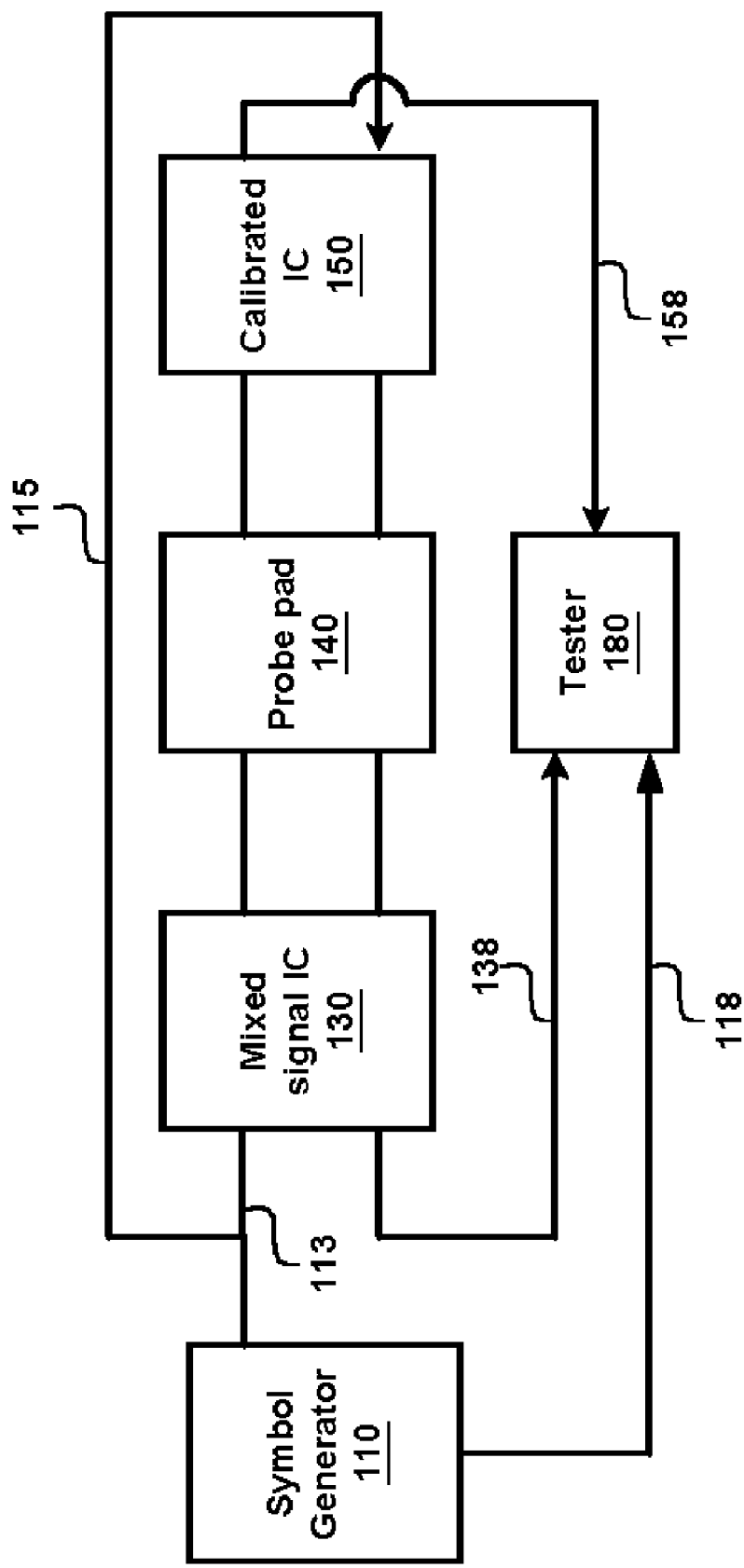
FIG. 1 is a block diagram illustrating an example environment in which the present invention may be implemented.

FIG. 1 is a block diagram illustrating an example environment in which various aspects of the present invention may be implemented. The block diagram is shown containing symbol generator 110, mixed signal IC 130, probe pad 140, calibrated IC 150, and tester 180. Each block is described below in detail.

Symbol generator 110 generates a sequence of symbols used for testing mixed signal IC 130. As described below, the symbols can be used to test both the receive and the transmit paths of mixed signal IC 130. In an embodiment, each symbol contains two vector (I and Q) components, each being referred to as a digital data element.

Probe pad 140 enables the electrical connection of appropriate signal leads of the two ICs 130 and 150. For example, the transmit path of one IC may be connected to the receive path of the other IC. The connections thus provided enable mixed signal IC 130 to be tested without being packaged, thereby avoiding unneeded wastage of resources with respect to ICs that are eventually discarded. Probe pad 140 can be implemented using one of several commercially available products.

Mixed signal IC 130 represents an example IC which can be tested using various aspects of the present invention. Calibrated IC 150 represents an IC which is already tested and/or calibrated such that the operation of the IC can be assumed to be accurate while performing tests.

Tester 180 tests mixed signal IC 130 according to various aspects of the present invention. Tester 180 may receive from symbol generator 110 the data inputs (symbols/vectors) used for such testing. In an embodiment, the entire transmit and receive paths are tested. The manner in which mixed signal IC 130 can be tested in such an environment is described below with additional examples.

3. Method

Figure 2:
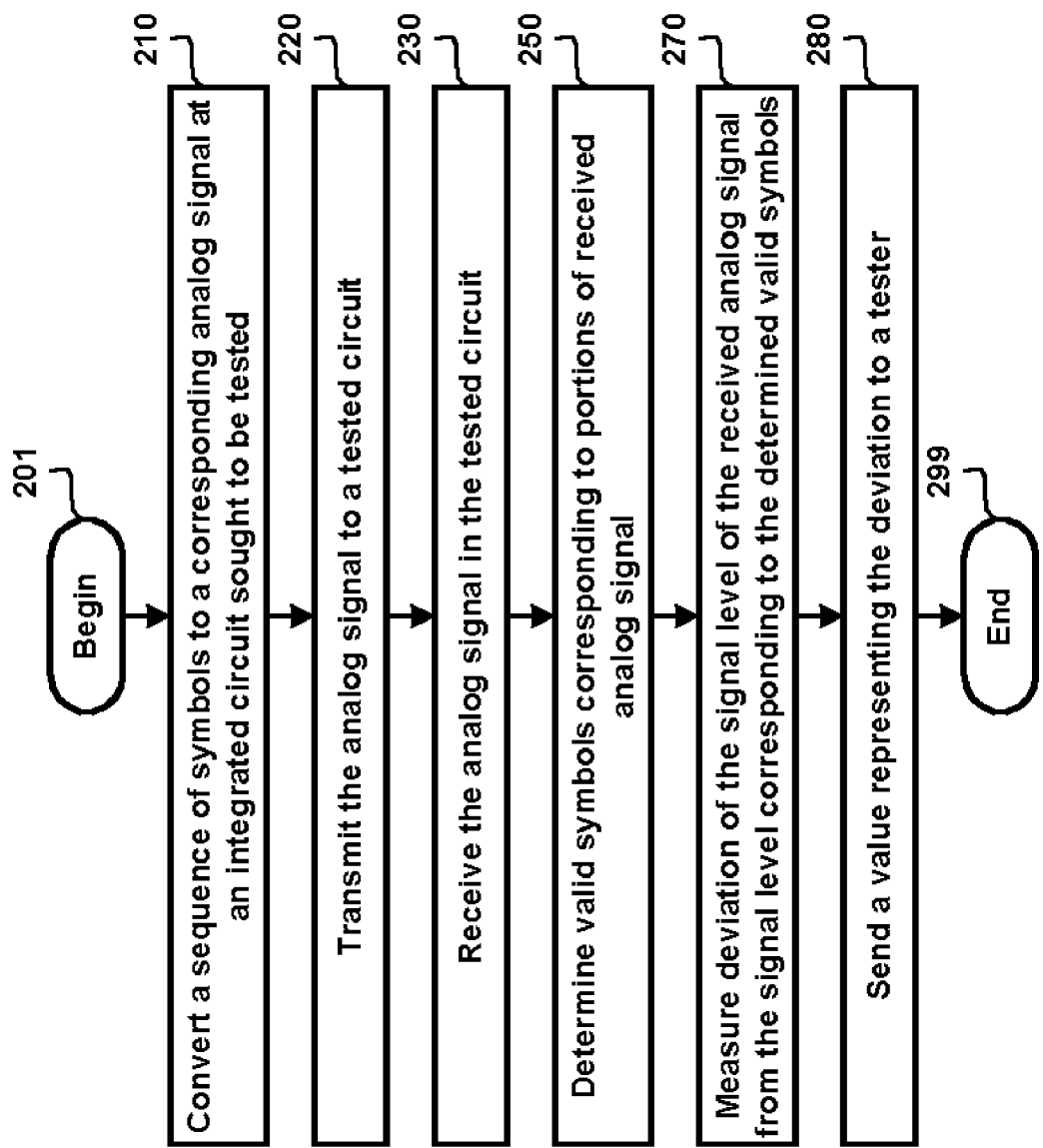
FIG. 2 is a flow-chart illustrating the details of a method using which testing of an IC may be performed according to an aspect of present invention.

FIG. 2 is a flow-chart illustrating the details of a method using which a mixed signal IC may be tested according to an aspect of present invention. The method is described with reference to FIG. 1 for illustration. However, various aspects of the present invention can be implemented in other environments as well, as will be apparent to one skilled in the relevant arts by reading the disclosure provided herein.

For illustration, it is assumed that mixed signal IC 130 is operating in transmit-mode and calibrated IC 150 is operating in receive-mode. However, similar approach may be used to test mixed signal IC 130 in the reverse direction (i.e., mixed signal IC 130 receiving from calibrated IC 150). The method begins in step 201 in which the control immediately passes to step 210.

In step 210, mixed signal IC 130 converts a sequence of symbols to a corresponding analog signal. Thus, a portion of the analog signal may be generated from a corresponding symbol. symbols may be provided to mixed signal IC 130 by symbol generator 110.

In step 220, mixed signal IC 130 transmits the analog signal to calibrated IC 150. The analog signal may be transmitted to calibrated IC 150 via probe pad 140. In step 230, the analog signal is received by calibrated IC 150.

In step 250, calibrated IC 150 determines valid symbols corresponding to the portions of received analog signal. For example, the voltage level of a portion of the received analog signal may be examined to determine the closest voltage level associated with one of the valid symbols. Such a symbol may be deemed to be the valid symbol for the corresponding analog signal portion. An example approach to determine valid symbols in case a symbol contains multiple vector components, is described below in further detail.

In step 270, calibrated IC 150 measures the deviation of the signal level of the received analog signal from the signal level corresponding to the determined valid symbols. One of various known approaches may be used for such measurement depending on the manner in which the symbols are represented, etc. In an embodiment described below, the deviation of may be measured according to IEEE 802.11a protocol standard well known in the relevant arts.

In step 280, a value representing the deviation to is sent to tester 180, which compares the received value with a pre-specified threshold value. Mixed signal IC 130 may be determined to be acceptable (qualified) if the value is less than the threshold value, and may be discarded otherwise. The method ends in step 299.

As the IC (i.e., calibrated IC 150) at the other end is calibrated, the deviation from the determined valid symbols generally represents the error introduced by the IC sought to be tested. Accordingly, a measure of the deviations can be used to qualify or discard an IC. The description is continued with respect to example embodiment(s) implementing various features described above.

4. Testing a Mixed Signal Integrated Circuit

Figure 3:
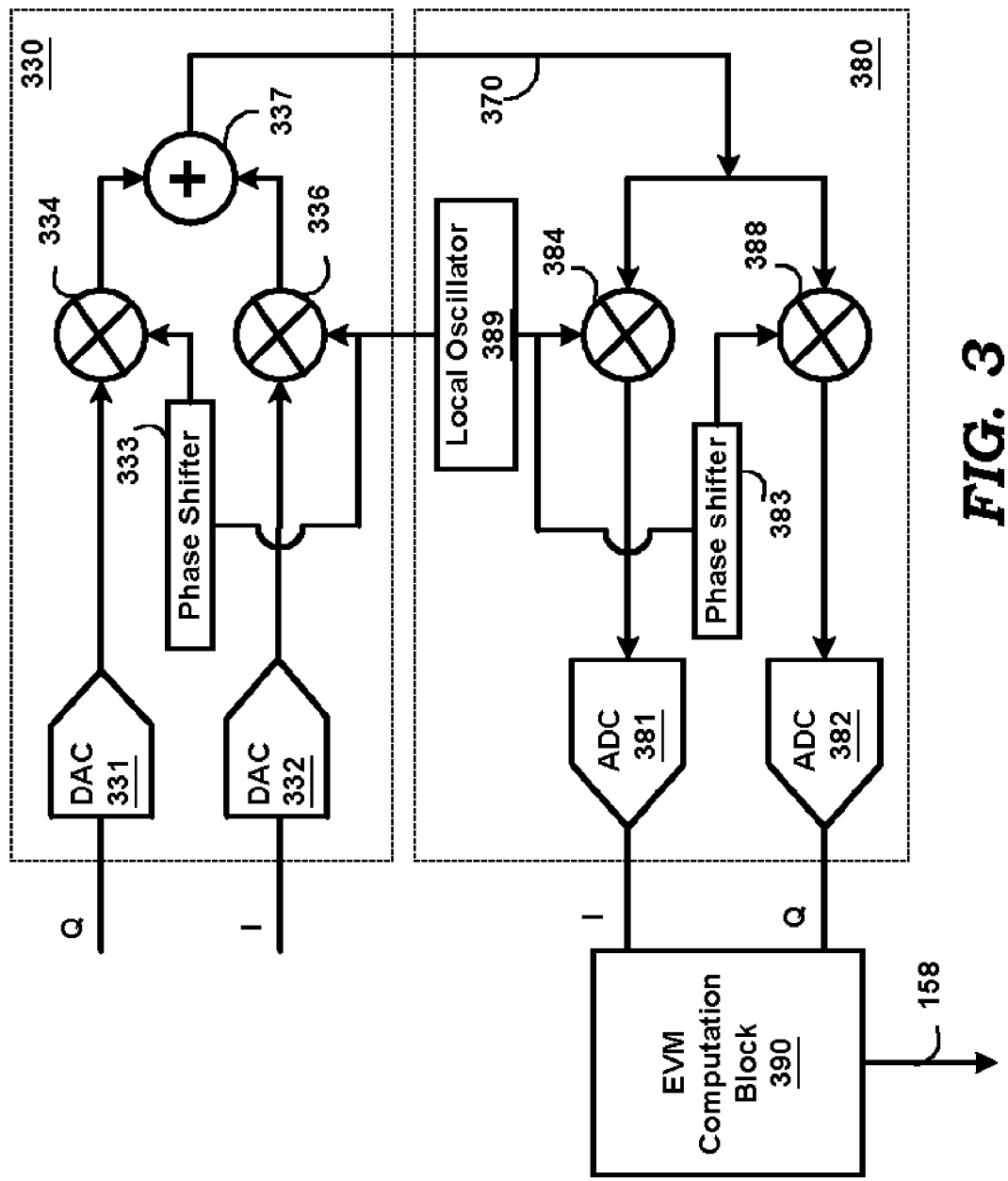
FIG. 3 is a block diagram illustrating the details of testing a transceiver according to an aspect of the present invention.

FIG. 3 is a block diagram illustrating the details of testing a mixed signal integrated circuit according to an aspect of the present invention. The block diagram is shown containing details of transmitter 330 (e.g., contained in mixed signal IC 130) and receiver 380 (e.g., contained in calibrated IC 150) assumed to be contained in different ICs. However, it should be appreciated that typical ICs contain both transmitter and receiver. Each block of Figure 3 is described below in further detail.

Transmitter 330 (contained in mixed signal IC 130) is shown containing digital to analog converters (DAC) 331 and 332, up-conversion mixers 334 and 336, and adder 337. DACs 331 and 332 respectively generate a corresponding baseband signal by converting a component (I and Q respectively) of an input symbol received on path 113. Each pair of corresponding I and Q components forms a transmitted symbol. The resulting baseband signals are provided as inputs to up-conversion mixers 334 and 336.

It should be understood that the path from DAC 331 to mixer 334 may contain several components such as filters and amplifiers (which may together be referred to as an analog front end). Similar components may also be present in the path from DAC 332 to mixer 336, mixer 384 to ADC 381, and mixer 388 and ADC 382. Such components are not shown merely to avoid obscuring various aspects of the present invention. However, various aspects of the present invention ensure that all such intermediate components in both the transmit and receive paths are tested.

A common carrier signal is shown received from local oscillator 389 (contained in receiver 380), and accordingly a separate local oscillator is not shown to be present in transmitter 330. By using a common carrier signal, various challenges related to synchronization may be avoided during testing. However, transmitter 330 contains a local oscillator implemented to operate in a manner similar to that of local oscillator 389 described below. Phase shifter 333 shifts an input signal (received from oscillator 389) by 90 degrees, and the shifted signal is provided as a carrier signal to up-conversion mixer 334.

Up-conversion mixer 334 modulates the carrier signal using the baseband signal (encoding the sequence of vector components) received from DAC 331, and generates a modulated carrier signal component. Similarly, up-conversion mixer 336 also generates another modulated carrier signal component by modulating the corresponding carrier signal. Due to the operation of phase shifter 333, the two carrier signals are out-of-phase by 90 degrees. Adder 337 logically represents the addition of the two modulated carrier signal components, and the resulting analog signal is provided on path 370.

Receiver 380 is shown containing analog-to-digital convertors (ADC) 381 and 382, down_conversion mixers 384 and 388, and local oscillator 389. Local oscillator 389 generates a carrier signal, which is phase-shifted by 90 degrees by phase shifter 383. The two signals (out-of-phase by 90 degrees) are provided as respective carrier signals to down-conversion mixers 384 and 388. As noted above, local oscillator 389 may provide the carrier signals for transmitter 330 as well.

Down_conversion mixer 384 de_modulates one of the two (here the output generated by up-conversion mixer 336) out-of-phase components present in the analog signal received on path 370 using the carrier signal received from oscillator 389 to generate a corresponding baseband signal. Similarly, down conversion mixer 388 demodulates the other phase component of the received analog signal using the carrier signal received from phase shifter 383, and provides the resulting baseband signal to ADC 382.

ADC 381 generates a sequence of I-vector components by sampling the baseband signal received from down-conversion mixer 384. ADC 382 generates a sequence of Q-vector components by sampling the baseband signal received from down-conversion mixer 388. It may be appreciated each pair of corresponding I and Q vector components together form a received vector combination.

EVM computation block 390 computes a error vector magnitude (EVM) based on the received vector combinations from the corresponding valid symbols. The EVM is provided as an input to tester 180, which determines whether to qualify/discard mixed signal IC 130. EVM computation block 390 may be implemented within or external to mixed signal IC 130. The operation of an embodiment of EVM computation block 390 is described below in further detail.

5. Error Vector Magnitude (EVM)

Figure 4:
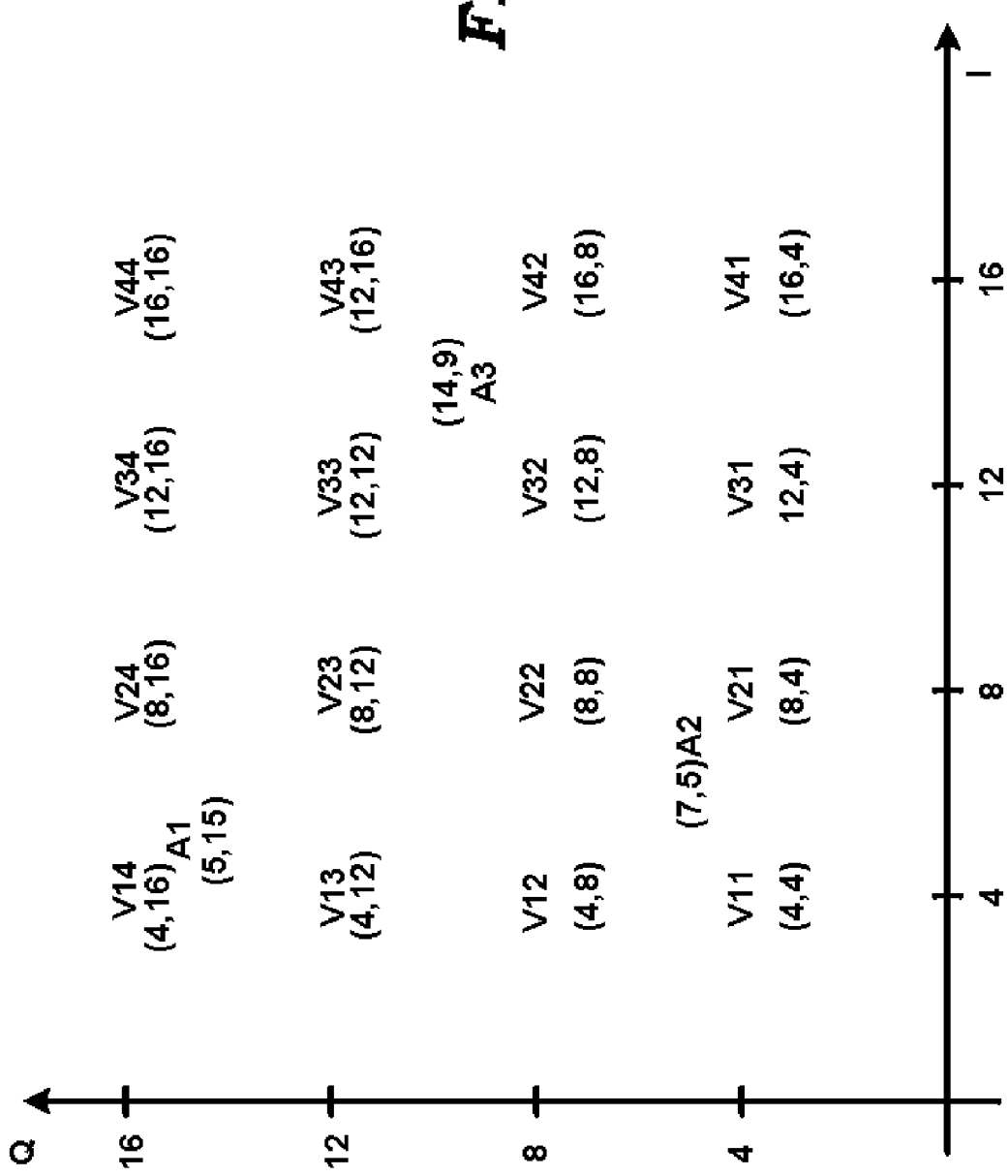
FIG. 4 is a constellation diagram illustrating the manner in which error vector magnitude may be measured, which in turn is used to determine whether to discard/qualify a mixed signal IC.

FIG. 4 is a constellation diagram illustrating the manner in which the deviation of received vector combinations from corresponding valid symbols may be measured in one embodiment. As noted above, the deviation is used to discard/qualify an integrated circuit. The constellation diagram is shown containing values for I and Q vector components along x-axis and y-axis respectively. Sixteen points ((4,4) (4,8), . . . (16,16)) represent the corresponding sixteen valid symbols V11 through V44.

For illustration, it is assumed that ADC 381 generates a sequence of vector components (for I vector) equaling (5, 7, and 14), and ADC 382 generates the corresponding values of Q vector equaling (15, 5, and 9). As may be appreciated, the generated component values represent the voltage levels of the respective portion of the analog baseband signal sampled by the ADC. Thus, three received vector combinations equaling A1 (5, 15), A2 (7, 5), and A3(14, 9) are provided to EVM computation block 390, which generates the EVM value.

EVM computation block 390 may then determine the valid symbols corresponding to the received vector combinations. In one embodiment, the component values representing the transmitted symbols (provided to DACs 331 and 332) are also provided to EVM computation block 390 (connection to EVM computation block 390 not shown). Thus, such provided values are used to compute the EVM.

In an alternative embodiment, each component of the received vector combination is mapped to a corresponding closest valid component. The valid components then form the valid symbol corresponding to the received vector combination. For example, with respect to A1 (5, 15), the value 5 may be mapped to 4, and the value 15 is mapped to 16, thereby determining the corresponding valid symbol to equal (4, 16). Similarly, (8, 4) and (16, 8) are respectively determined to be the corresponding valid symbols for A2 (7, 5) and A3 (14, 9).

The deviation of each received vector combination from a corresponding valid symbol may be measured by the geometric distance between the two symbols. EVM may be computed as equal to root-mean-square (RMS) average of deviations for a sequence of received vector combinations. In the illustrative example, EVM is computed as equal to square root of $\{((5-4)^2+(15-16)^2)+((7-8)^2+(5-4)^2)+((14-16)^2+(9-8)^2)\}=3$. Alternatively, EVM may be measured by the RMS average of all errors in a packet (or sequence of symbols) as specified by 802.11a wireless standard, well known in the relevant arts.

Mixed signal IC 130 may then be either discarded or qualified based on the EVM value thus generated. The mixed signal ICs thus tested can be placed in various devices. An example device is described briefly below.

6. Example Device

Figure 5:
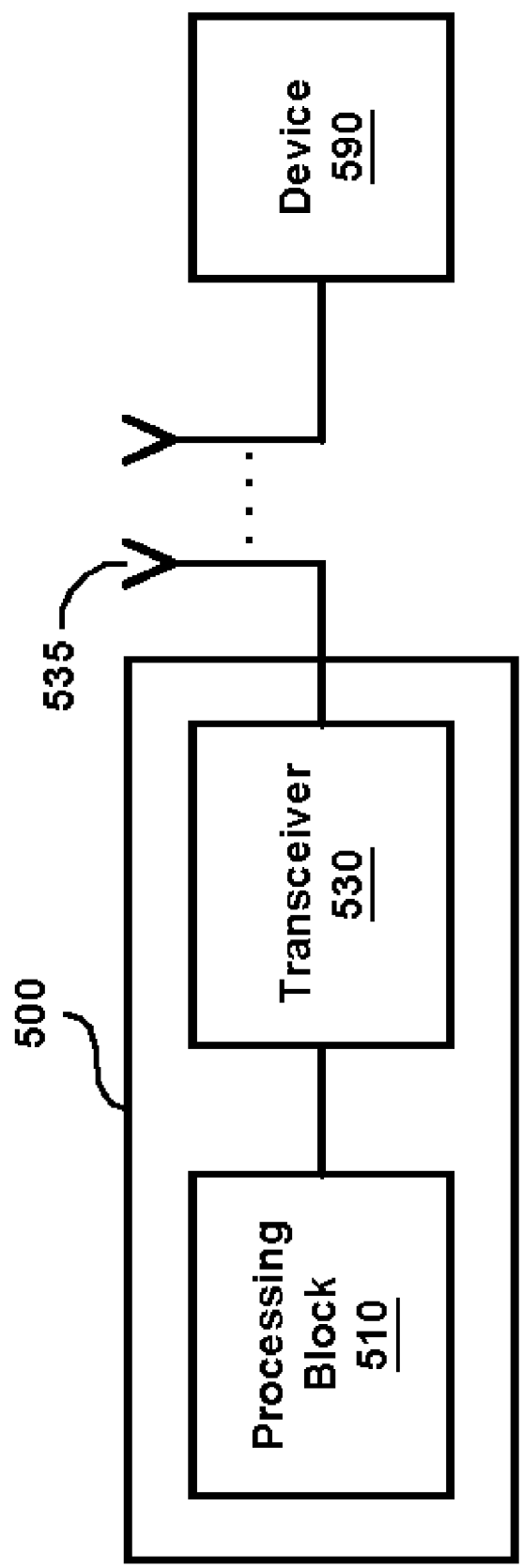
FIG. 5 is a block diagram illustrating an example device in which various aspects of the present invention can be implemented.

FIG. 5 is a block diagram illustrating an example device in which various aspects of the present invention can be implemented. Device 500 is shown containing processing block 510 and transceiver 530.530 may be implemented using receiver 380 and transmitter 330 described above. Transceiver 530 is used to send symbols generated by processing block 510 in the form of analog signals using antenna 535. transceiver 530 is used to receive analog signals, and provide the corresponding symbols (or equivalent bit stream) to processing block 510.

Processing block 510 implements various applications (such as converting the data to audible voice in the case of a mobile phone, data networking applications, etc.) using the data stream contained in the symbols.

7. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of testing an integrated circuit (IC) containing a transmit path and a receive path, said method comprising:

connecting said transmit path of said IC to a receive path of a calibrated IC, and said receive path of said IC to a transmit path of said calibrated IC, wherein said IC is provided in the form of a stand-alone die;

transmitting a first signal from said IC to said calibrated IC on said transmit path of said IC;

receiving said first signal in said calibrated IC; and examining said first signal in said calibrated IC to determine whether to discard/qualify said IC.

2. method of claim 1, wherein said IC comprises a mixed signal IC and said calibrated IC is also of mixed signal form, said method further comprising:

converting a first digital data element to an analog signal, wherein said first signal comprises said analog signal, and wherein said analog signal is transmitted on said transmit path of said IC.

3. The method of claim 2, wherein said mixed signal IC is connected to said calibrated IC by a probe pad, wherein said probe pad connects a signal lead of said transmit path of said mixed signal IC to a signal lead of said receive path of said calibrated signal IC.

4. The method of claim 2, further comprising:
converting another digital data element to another analog signal;
transmitting said another analog signal from said calibrated IC to said mixed signal IC; and
examining said another analog signal in said mixed signal IC to determine whether to discard/qualify said mixed signal IC.

5. A method of testing a mixed signal integrated circuit (IC), said method comprising:
converting a digital data element to an analog signal in said mixed signal IC;
transmitting said analog signal to said calibrated IC;
receiving said analog signal in said calibrated IC; and
examining said analog signal in said calibrated IC to measure a deviation of a signal level of said analog signal from a signal level corresponding to said digital data element;
wherein a decision to discard/qualify said mixed signal IC is based on said deviation.

6. The method of claim 5, wherein said mixed signal IC is tested in the form of a stand-alone die, wherein a probe pad connects a transmit path of said mixed signal IC to a receive path of said calibrated IC, and a receive path of said mixed signal IC to a transmit path of said calibrated IC.

7. The method of claim 5, wherein said mixed signal IC is designed to operate with a plurality of valid symbols contained in a constellation table, wherein each of said plurality of valid symbols contains a plurality of vector components, said method further comprising:
generating in said mixed signal IC each of a plurality of baseband signals by converting a corresponding sequence of vector components, wherein said sequence of vector components comprise said digital data element, wherein corresponding vector components form a transmitted symbol;
modulating each of said plurality of baseband signals with a corresponding one of a plurality of carrier signals to generate a corresponding one of a plurality of modulated signals, wherein each of said plurality of baseband signals are phase-shifted at least by some degree with respect to each other; and
combining in said mixed signal IC said plurality of modulated signals to generate said analog signal transmitted to said calibrated IC.

8. The method of claim 7, further comprising:
demodulating in said calibrated IC, said analog signal using a corresponding one of said carrier signals to generate a corresponding one of a plurality of demodulated signals;
converting each of said plurality of demodulated signals into a corresponding sequence of vector components, wherein corresponding vector components form a vector combination;
determining said deviation based on each of said vector combinations and a corresponding valid symbol.

9. The method of claim 8, wherein said determining comprises:
receiving vector components corresponding to said transmitted symbol, wherein said corresponding valid symbol comprises said transmitted symbol; and
computing said deviation based on a vector distance between said transmitted symbol and said vector combination corresponding to said transmitted symbol.

10. The method of claim 8, wherein said determining comprises:
finding a closest valid symbol to said vector combination, wherein said corresponding valid symbol comprises said closest valid symbol; and
computing said deviation based on a vector distance between said vector combination and said closest valid symbol.

11. The method of claim 8, wherein said deviation is determined based on 802.11a wire-less standard.

12. The method of claim 8, wherein each of said symbols contain only two vector components.

13. A mixed signal integrated circuit (IC) containing a built-in-self-test capability, said mixed signal IC comprising:
a receiver-block receiving an analog signal, said analog signal being generated externally by converting a digital data element; and
a computation block examining said analog signal to measure a deviation of a signal level of said analog signal from a signal level corresponding to said digital data element, wherein
a decision to discard/qualify said mixed signal IC is based on said deviation,
said mixed signal IC is designed to operate with a plurality of valid symbols contained in a constellation table, wherein each of said plurality of valid symbols contains a plurality of vector components, and
said computation block comprising a error vector magnitude (EVM) computation block, said EVM computation block determining said deviation based on each of said vector combinations and a corresponding valid symbol.

14. The mixed signal IC of claim 13, said mixed signal IC further comprising a transmitter block, wherein said transmitter block comprises:
a plurality of digital-to-analog convertors generating each of a plurality of baseband signals by converting a corresponding sequence of vector components, wherein corresponding vector components form a transmitted symbol;
a plurality of up-conversion mixers modulating each of said plurality of baseband signals with a corresponding one of a plurality of carrier signals to generate a corresponding one of a plurality of modulated signals, wherein each of said plurality of baseband signals are phase-shifted at least by some degree with respect to each other; and
an adder combining said plurality of modulated signals to generate another analog signal.

15. The mixed signal IC of claim 13, wherein said receiver block comprises:
a plurality of down-conversion mixers demodulating said analog signal using a corresponding one of a carrier signals to generate a corresponding one of a plurality of demodulated signals;
a plurality of analog-to digital convertors converting each of said plurality of demodulated signals into a corresponding sequence of vector components, wherein corresponding vector components form a vector combination.

16. The mixed signal IC of claim 15, wherein said EVM computation block receives vector components corresponding to a transmitted symbol based on which said analog signal is formed, said EVM computation block computing said deviation based on a vector distance between said transmitted symbol and said vector combination corresponding to said transmitted symbol.

17. The mixed signal IC of claim 15, wherein EVM computation block finds a closest valid symbol to said vector combination, wherein said corresponding valid symbol comprises said closest valid symbol, said EVM computation block computing said deviation based on a vector distance between said vector combination and said closest valid symbol.

18. The mixed signal IC of claim 15, wherein said deviation is determined based on 802.11a wire-less standard.

19. A mixed signal integrated circuit (IC) containing a built-in-self-test capability, said mixed signal IC comprising:
   means for receiving an analog signal, said analog signal being generated externally by converting a digital data element; and
   means for measuring a deviation of a signal level of said analog signal from a signal level corresponding to said digital data element, wherein
   a decision to discard/qualify said mixed signal IC is based on said deviation,
   said mixed signal IC is designed to operate with a plurality of valid symbols contained in a constellation table, wherein each of said plurality of valid symbols contains a plurality of vector components, and
   said means for measuring a deviation comprising means for computing error vector magnitude (EVM), said means for computing EVM determining said deviation based on each of said vector combinations and a corresponding valid symbol.

20. The apparatus of claim 19, wherein said mixed signal IC is designed to operate with a plurality of valid symbols contained in a constellation table, wherein each of said plurality of valid symbols contains a plurality of vector components, wherein said means for receiving is operable to:
   demodulate said analog signal using a corresponding one of a carrier signals to generate a corresponding one of a plurality of demodulated signals; and
   convert each of said plurality of demodulated signals into a corresponding sequence of vector components, wherein corresponding vector components form a vector combination;
   wherein said means for measuring computes said deviation based on each of said vector combinations and a corresponding valid symbol.

21. The mixed signal IC of claim 20, wherein said means for measuring receives vector components corresponding to a transmitted symbol based on which said analog signal is formed, said means for measuring computing said deviation based on a vector distance between said transmitted symbol and said vector combination corresponding to said transmitted symbol.

22. The mixed signal IC of claim 20, wherein means for measuring finds a closest valid symbol to said vector combination, wherein said corresponding valid symbol comprises said closest valid symbol, said means for measuring computing said deviation based on a vector distance between said vector combination and said closest valid symbol.

23. A device comprising:
   a processing block; and
   a mixed signal integrated circuit (IC) containing a built-in-self-test capability, said mixed signal IC comprising;
   a receiver block receiving an analog signal, said analog signal being generated externally by converting a digital data element; and
   a computation block examining said analog signal to measure a deviation of a signal level of said analog signal from a signal level corresponding to said digital data element;
   wherein a decision to discard/qualify said mixed signal IC is based on said deviation.

24. The device of claim 23, wherein said mixed signal IC is designed to operate with a plurality of valid symbols contained in a constellation table, wherein each of said plurality of valid symbols contains a plurality of vector components, said mixed signal IC further comprising a transmitter block, wherein said transmitter block comprises:
   a plurality of digital-to-analog convertors generating each of a plurality of baseband signals by converting a corresponding sequence of vector components, wherein corresponding vector components form a transmitted symbol;
   a plurality of up-conversion mixers modulating each of said plurality of baseband signals with a corresponding one of a plurality of carrier signals to generate a corresponding one of a plurality of modulated signals, wherein each of said plurality of baseband signals are phase-shifted at least by some degree with respect to each other; and
   an adder combining said plurality of modulated signals to generate another analog signal.

25. The device of claim 23, wherein said receiver block comprises:
   a plurality of down-conversion mixers demodulating said analog signal using a corresponding one of a carrier signals to generate a corresponding one of a plurality of demodulated signals; and
   a plurality of analog-to-digital convertors converting each of said plurality of demodulated signals into a corresponding sequence of vector components, wherein corresponding vector components form a vector combination;
   said computation block comprising a error vector magnitude (EVM) computation block, said EVM computation block determining said deviation based on each of said vector combinations and a corresponding valid symbol.

26. The device of claim 25, wherein said EVM computation block receives vector components corresponding to a transmitted symbol based on which said analog signal is formed, said EVM computation block computing said deviation based on a vector distance between said transmitted symbol and said vector combination corresponding to said transmitted symbol.

27. The device of claim 25, wherein EVM computation block finds a closest valid symbol to said vector combination, wherein said corresponding valid symbol comprises said closest valid symbol, said EVM computation block computing said deviation based on a vector distance between said vector combination and said closest valid symbol.

* * * * *